(12) United States Patent
Bateman et al.

(10) Patent No.: US 8,993,373 B2
(45) Date of Patent: Mar. 31, 2015

(54) DOPING PATTERN FOR POINT CONTACT SOLAR CELLS

(75) Inventors: Nicholas Bateman, Reading, MA (US); John Graff, Swampscott, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/464,582

(22) Filed: May 4, 2012

(65) Prior Publication Data

US 2013/0291932 A1 Nov. 7, 2013

(51) Int. Cl.
*H01L 31/0352* (2006.01)
*H01L 31/18* (2006.01)
*H01L 31/068* (2012.01)

(52) U.S. Cl.
CPC ........ *H01L 31/0682* (2013.01); *H01L 31/1804* (2013.01); *Y02E 10/547* (2013.01)
USPC ................... 438/98; 438/61; 438/79; 438/96; 438/97; 438/99

(58) Field of Classification Search
CPC ............. Y02E 10/50; H01L 31/03682; H01L 31/1804; H01L 21/02532; H01L 31/03921
USPC .......................................................... 438/98
See application file for complete search history.

(56) References Cited

U.S. PATENT DOCUMENTS

| | | | |
|---|---|---|---|
| 6,320,229 B1 * | 11/2001 | Uchikoba et al. ............. | 257/355 |
| 8,008,575 B2 | 8/2011 | DeCeuster et al. | |
| 2008/0017243 A1 | 1/2008 | DeCeuster | |
| 2009/0227095 A1 | 9/2009 | Bateman | |
| 2010/0224240 A1 * | 9/2010 | Bateman et al. ............. | 136/255 |
| 2010/0304522 A1 | 12/2010 | Rana | |
| 2011/0023956 A1 | 2/2011 | Harder | |

OTHER PUBLICATIONS

R. Stangl, et al., "Planar rear emitter back contact amorphous/crystalline silicon heterojunction solar cells (RECASH/Precash)," 2008 33rd IEEE Photovolatic Specialists Conference, May 1, 2008, p. 1-6.
International Search Report and Written Opinion mailed Oct. 8, 2013 for PCT/US2013/039096 dated May 1, 2013.
Kotsovos, K., et al., Base Limited Carrier Transport and Performance of Double Junction Rear Point Contact Silicon Solar Cells, Solar Energy Materials & Solar Cells 77, 2003, pp. 209-227, Elsevier, Amsterdam, The Netherlands.
Swanson, R.M., Point-Contact Solar Cells: Modeling and Experiment, Solar Cells 17, 1986, pp. 85-118, Elsevier Sequoia, The Netherlands.

(Continued)

*Primary Examiner* — Hoai V Pham
*Assistant Examiner* — Long Le

(57) ABSTRACT

Methods of doping a solar cell, particularly a point contact solar cell, are disclosed. One surface of a solar cell may require portions to be n-doped, while other portions are p-doped. At least one lithography step can be eliminated by the use of a blanket doping of species having one conductivity and a patterned counterdoping process of species having the opposite conductivity. The areas doped during the patterned implant receive a sufficient dose so as to completely reverse the effect of the blanket doping and achieve a conductivity that is opposite the blanket doping. In some embodiments, counterdoped lines are also used to reduce lateral series resistance of the majority carriers.

11 Claims, 11 Drawing Sheets

(56) References Cited

OTHER PUBLICATIONS

Swanson, Richard M., et al., Point-Contact Silicon Solar Cells, IEEE Transactions on Electron Devices, May 1984 pp. 661-664, vol. ED-31, No. 5, IEEE.

Luque, Antonio, Analysis of High Efficiency Back Point Contact Silicon Solar Cells, Solid-State Electronics, 1988, pp. 65-79, vol. 31, No. 1, Pergamon Journals Ltd., Great Britain.

* cited by examiner

DOPING PATTERN FOR POINT CONTACT SOLAR CELLS

FIELD

This invention relates to doping solar cells, and, more particularly, to doping patterns for point contact solar cells.

BACKGROUND

Ion implantation is a standard technique for introducing conductivity-altering impurities into semiconductor substrates. A desired impurity material is ionized in an ion source, the ions are accelerated to form an ion beam of prescribed energy, and the ion beam is directed at the surface of the substrate. The energetic ions in the beam penetrate into the bulk of the semiconductor material and are embedded into the crystalline lattice of the semiconductor material to form a region of desired conductivity.

Ion implantation may be used to manufacture solar cells. A solar cell is a device having an in-built electric field that separates the charge carriers generated through the absorption of photons in the semiconductor material. This electric field is typically created through the formation of a p-n junction (diode), which is created by differential doping of the semiconductor material. Doping a part of the solar cell substrate (e.g. surface region) with impurities of opposite polarity forms a p-n junction that may be used as a photovoltaic device converting light into electricity.

FIG. 1 shows a first embodiment of a solar cell, and is a cross section of a representative substrate 150. Photons 160 enter the solar cell 150 through the top surface 162, as signified by the arrows. These photons 160 pass through an anti-reflective coating 152, designed to maximize the number of photons 160 that penetrate the substrate 150 and minimize those that are reflected away from the substrate 150.

Internally, the solar cell 150 is formed so as to have a p-n junction 170. This p-n junction 170 is shown as being substantially parallel to the top surface 162 of the substrate 150 although there are other implementations where the p-n junction 170 may not be parallel to the top surface 162. The solar cell 150 is fabricated such that the photons 160 enter the solar cell 150 through a heavily doped region, also known as the emitter 153. In some embodiments, the emitter 153 may be an n-type doped region, while in other embodiments, the emitter 153 may be a p-type doped region. The photons 160 with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron hole (e-h) pairs need to be separated. This is done through the built-in electric field at the p-n junction 170. Thus any e-h pairs that are generated in the depletion region of the p-n junction 170 get separated, as are any other minority carriers that diffuse to the depletion region of the solar cell 150. Since a majority of the incident photons 160 are absorbed in near surface regions of the solar cell 150, the minority carriers generated in the emitter 153 need to diffuse across the depth of the emitter 153 to reach the depletion region and get swept across to the other side. Thus to maximize the collection of photo-generated current and minimize the chances of carrier recombination in the emitter 153, it is preferable to have the emitter 153 that is shallow.

Some photons 160 pass through the emitter 153 and enter the base 154. In the scenario where the emitter 153 is an n-type region, the base 154 is a p-type doped region. These photons 160 can then excite electrons within the base 154, which are free to move into the emitter 153, while the associated holes remain in the base 154. Alternatively, in the case where the emitter 153 is a p-type doped region, the base is an n-type doped region. In this case, these photons 160 can then excite electrons within the base 154, which remain in the base 154, while the associated holes move into the emitter 153. As a result of the charge separation caused by the presence of this p-n junction 170, the extra carriers (electrons and holes) generated by the photons can then be used to drive an external load to complete the circuit.

By externally connecting the emitter 153 to the base 154 through an external load, it is possible to conduct current and therefore provide power. To achieve this, contacts 151 and 155, typically metallic, are placed on the outer surface of the emitter 153 and the base 154, respectively. Since the base 154 does not receive the photons 160 directly, typically its contact 155 is placed along the entire outer surface. In contrast, the outer surface of the emitter 153 receives photons 160 and therefore cannot be completely covered with contacts 151. However, if the electrons have to travel great distances to the contact 151, the series resistance of the solar cell 150 increases, which lowers the power output. In an attempt to balance these two considerations (the distance that the free electrons must travel to the contact 151, and the amount of exposed emitter surface 163) most applications use contacts 151 that are in the form of fingers.

The embodiment shown in FIG. 1 requires contacts 151, 155 on both sides of the solar cell 150, thereby reducing the available area of the front surface through which photons 160 may pass. A cross section of a second embodiment of a solar cell 100 is shown in FIG. 2. Fundamentally, the physics of this embodiment is similar, in which a p-n junction is used to create an electric field which separates the generated electron hole pairs. However, rather than create the p-n junction across the entire surface, as done in the previous embodiment, the junctions are only created in portions of the solar cell 100. In this embodiment, a negatively doped silicon substrate (base 103) may be used. In certain embodiments, a more negatively biased front surface field (FSF) 102 is created by introducing addition n-type dopants in the front surface. This FSF 102 is then coated with an anti-reflective coating 101. This front, illuminated surface is often etched to create a pyramidal or other non-planar surface, so as to increase surface area. The metallic contacts, such as p contacts 107 and n contacts 108, and fingers 110 are all located on the bottom, non-illuminated surface of the solar cell 100. Certain portions of the bottom surface are doped with p-type dopants to create emitters 104. Other portions are doped with n-type dopants to create more negatively biased back surface field (BSF) 105. Typically, the regions between these emitters 104 and BSFs 105 are undoped and passivated with silicon oxide. The back surface is coated with a passivation layer 106 to enhance the reflectivity of the back surface. P contacts 107 and n contacts 108 are attached to the emitter 104 and the BSF 105. FIG. 3 shows one commonly used configuration where contacts are placed on the back non-illuminated surface. In this embodiment, the contacts are placed on one or more of the emitters 104 and the BSFs 105. This type of cell is known as a point contact solar cell.

With current energy costs and environmental concerns, solar cells are becoming more important globally. Any reduced cost to the manufacturing or production of high-performance solar cells or any efficiency improvement to high-performance solar cells would have a positive impact on the implementation of solar cells worldwide. This will enable the wider availability of this clean energy technology.

The current manufacturing process for point contact solar cells requires at least two lithography and diffusion steps on the backside of the solar cell to fabricate the contact and emitter regions. Removing any process steps would reduce the manufacturing costs and complexity for the solar cells. Furthermore, any process steps that improve the efficiency of the solar cell would be beneficial. Accordingly, there is a need in the art for an improved method of doping point contact solar cells.

SUMMARY

The shortcomings of the prior art are overcome by the present disclosure, which describes methods of doping a solar cell, particularly a point contact solar cell. One surface of a solar cell may require portions to be n-doped, while other portions are p-doped. Traditionally, a plurality of lithography and doping steps are required to achieve this desired configuration. In contrast, one lithography step can be eliminated by the use of a blanket doping of a species having one conductivity and a mask patterned counterdoping process of a species having the opposite conductivity. The areas doped during the patterned implant receive a sufficient dose so as to completely reverse the effect of the blanket doping and achieve a conductivity that is opposite the blanket doping. In some embodiments, counterdoped lines are also used to reduce lateral series resistance of the majority carriers.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the process described herein may be performed by, for example, a beam-line ion implanter, a flood implanter, or a plasma doping ion implanter. Such a plasma doping ion implanter may use RF or other plasma generation sources. The ion beam generated by the beam-line ion implanter or flood implanter may be mass analyzed or non-mass analyzed. Other plasma processing equipment or equipment that generates ions also may be used. Thermal or furnace diffusion, pastes on the surface of the solar cell substrate that are heated, epitaxial growth, or laser doping also may be used to perform certain embodiments of the process described herein. Furthermore, while a silicon solar cell is specifically disclosed, other solar cell substrate materials also may benefit from embodiments of the process described herein.

Figure 4:
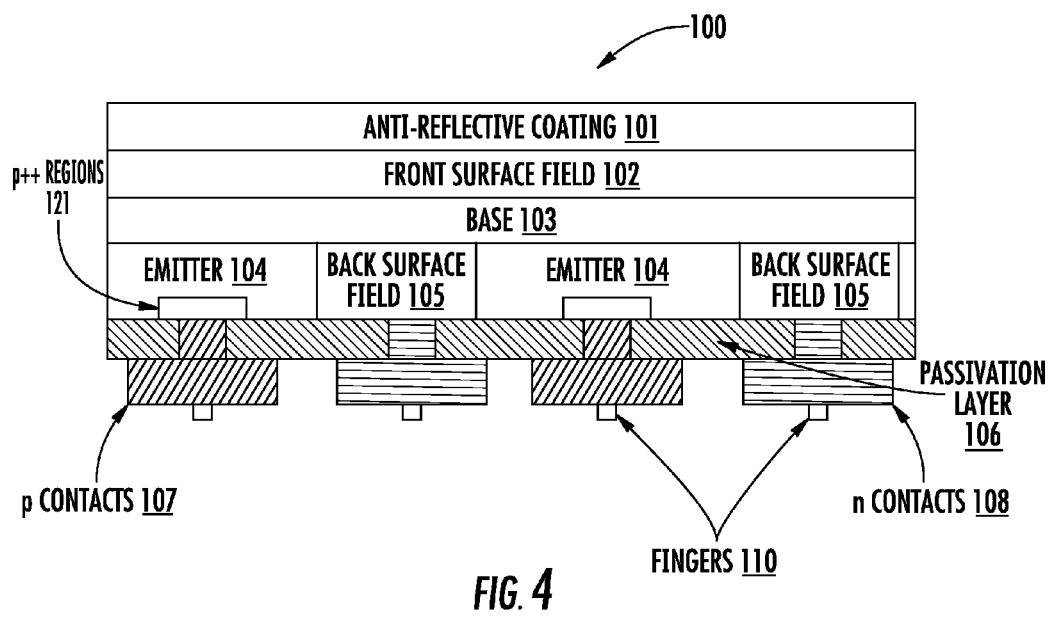
FIG. 4 is a cross-sectional view of an embodiment of an exemplary point contact solar cell in accordance with one embodiment.

FIG. 4 is an embodiment of an exemplary point contact solar cell. Other embodiments or designs are possible and the embodiments of the process described herein are not solely limited to the solar cell 100 illustrated in FIG. 4. As described above, solar cell 100 includes p contacts 107 and n contacts 108 on the backside of the solar cell 100. At the top of the solar cell 100 is an anti-reflective coating 101. Underneath the anti-reflective coating 101 may be a FSF 102 and a base 103. Underneath the base 103 are emitters 104 and BSFs 105. Underneath the emitters 104 and BSFs 105 is a passivation layer 106. The p contacts 107 and n contacts 108 may go through the passivation layer 106 to contact the emitters 104 and BSFs 105. In some embodiments, p++ regions 121 are added within the emitters 104 to reduce the resistance between the emitter 104 and the p contacts 107. Fingers 110, typically made of conductive metal, are attached to the p contacts 107 and n contacts 108.

Figure 1:
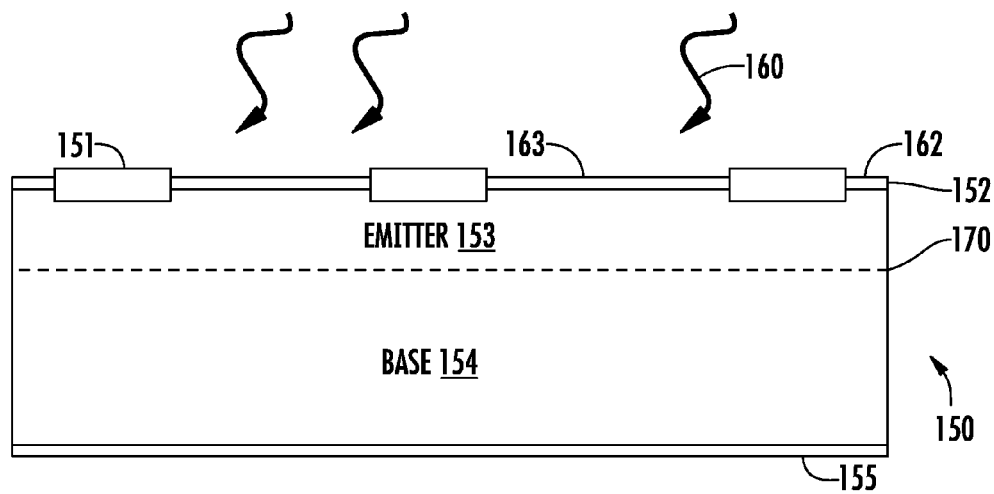
FIG. 1 is a cross-section view of an embodiment of a solar cell of the prior art.
Figure 2:
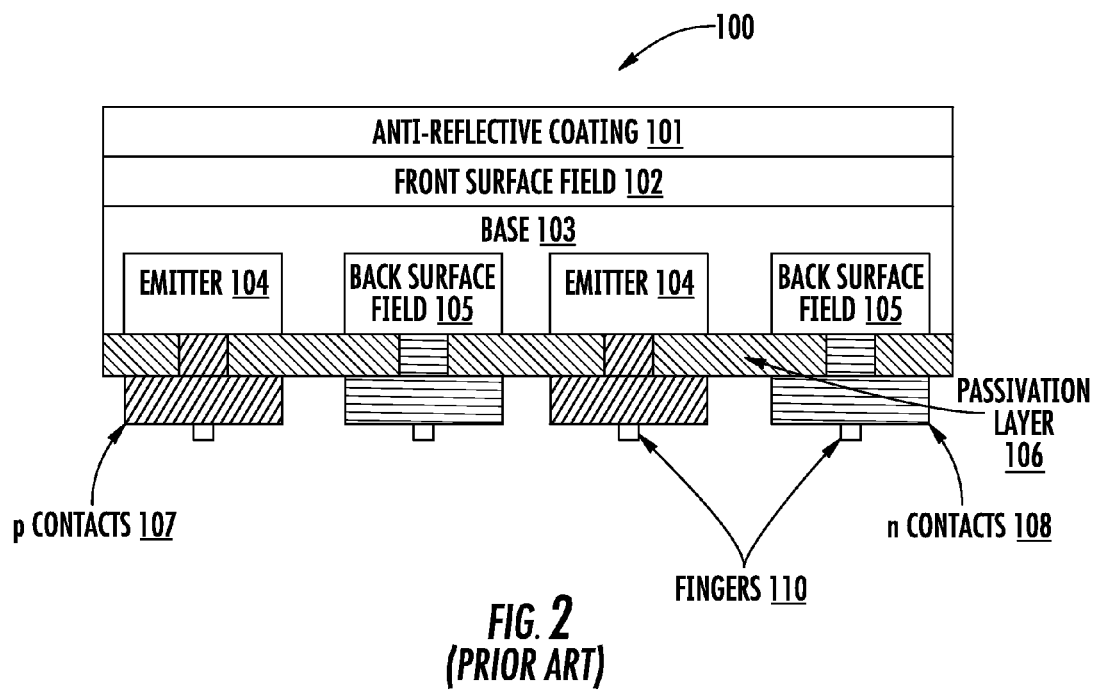
FIG. 2 is a cross-section view of an embodiment of a point contact solar cell of the prior art.
Figure 3:
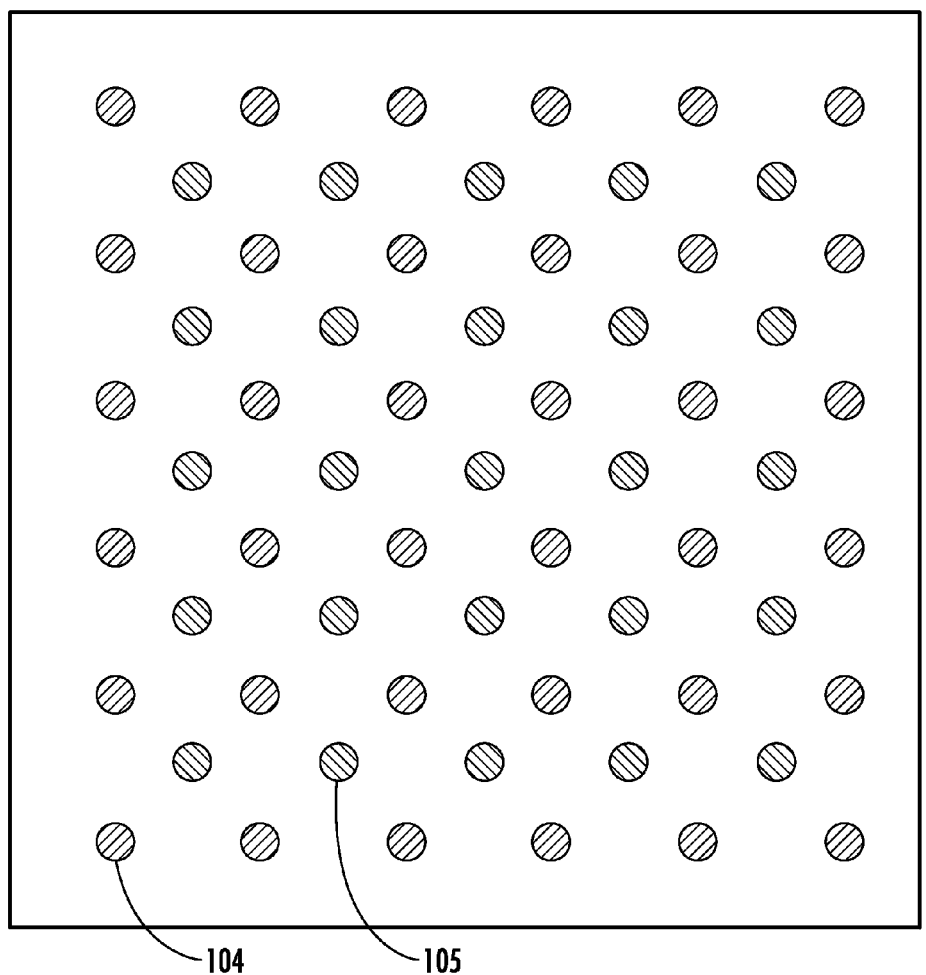
FIG. 3 is a bottom view of the solar cell of FIG. 2.

This point contact solar cell differs from that of FIG. 2 in that the entire bottom surface is doped. In other words, any areas which are not BSFs 105 are p-doped. This increases the overall size of the regions of the emitter 104 and increases the surface area of the p-n junction. In other words, this point contact solar cell extends prior art point contact cells by lightly doping the previously undoped regions.

Using counterdoping would allow elimination of at least one of the lithography steps. Counterdoping could eliminate both steps if a non-lithographic technique is used to pattern the dopant in the counterdoping doping process. Elimination of process steps would reduce the manufacturing complexity and manufacturing costs for solar cells.

Figure 5:
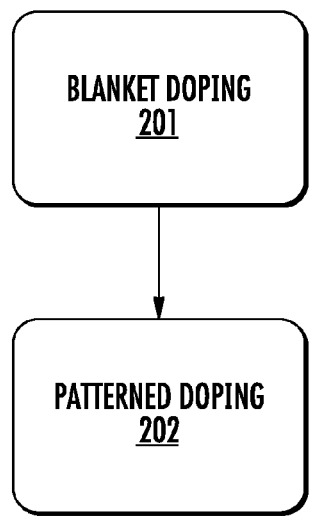
FIG. 5 is an embodiment of a solar cell manufacturing process flow.

FIG. 5 is an embodiment of a solar cell manufacturing process flow. To perform counterdoping of a solar cell (such as a point contact solar cell), two steps are required: a blanket doping 201 to form one type of semiconductor material. For example, boron may be applied to the entire substrate to form a p-doped emitter region. Following this, a patterned doping 202 in selected discrete regions of the solar cell at a higher dose is performed. This patterned doping 202 is performed using a dopant of opposite conductivity. Thus, if boron is used for the blanket doping, an element from Group V, such as phosphorus, may be used for the pattern doping. Since the area to which the pattern doping is applied has previously been doped, the dosage required must be sufficient to negate the effects of the earlier doping, and then introduce the desired concentration of ions. The result is that the patterned doping creates discrete regions of opposite conductivity to that created by the blanket doping.

Figure 6:
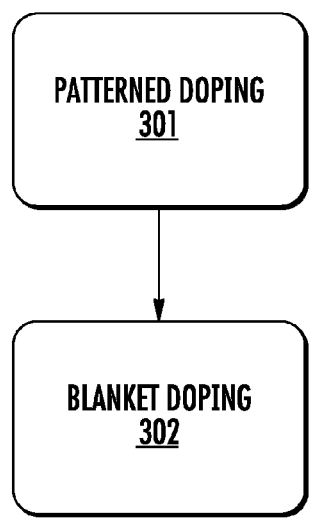
FIG. 6 is another embodiment of a solar cell manufacturing process flow.

FIG. 6 is another embodiment of a solar cell manufacturing process flow. In this embodiment, the steps performed in FIG. 5 are simply reversed. To perform counterdoping, a patterned doping 301 in selected discrete regions of the solar cell at a higher dose and then a blanket doping 302 to form another type of semiconductor material is performed. The patterned doping 301 is introduced at a sufficient dose such that the subsequent blanket doping 302 does not change its conductivity.

Figure 7:
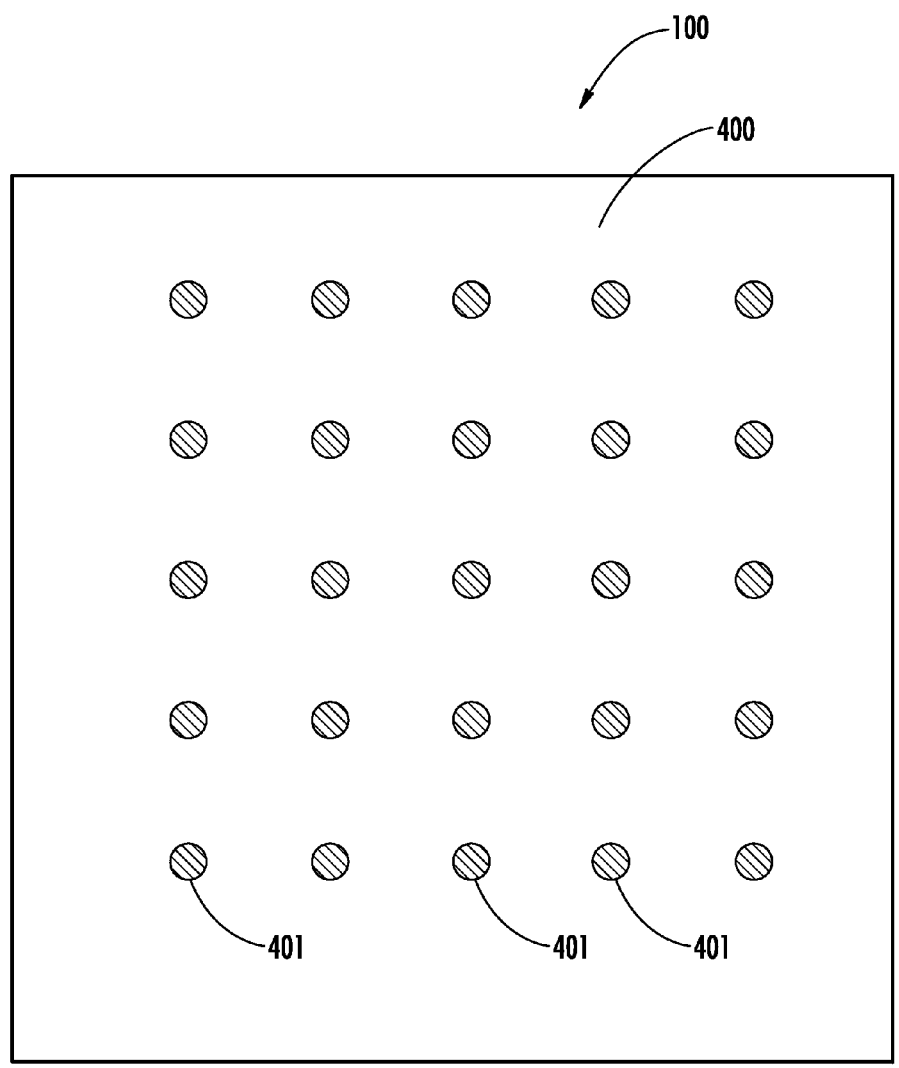
FIG. 7 is an embodiment of counterdoping in a point contact solar cell.

FIG. 7 is an embodiment of counterdoping. The solar cell 100 includes a blanket doped region 400 and discrete patterned doped regions 401. In some embodiments, the discrete patterned doped regions 401 may be circular, rectangular, or polygonal. These discrete patterned doped regions are referred to as dots, regardless of their shape. The blanket doped region 400 and discrete patterned doped regions 401 may be doped in either order or may be chained together without breaking vacuum. The blanket doped region 400 and discrete patterned doped regions 401 may use either n-type or p-type dopants. However, as stated above, counterdoping requires one region be an n-type dopant and the other region be a p-type dopant. Thus, while the doping with either type of dopant may occur first, different dopants must be used overall. In one particular instance, the blanket doped region 400 is a p-type emitter while the patterned doped regions 401 are n-type. Furthermore, the patterned doping must be applied in sufficient amounts to overcome the conductivity produced by the blanket doping. If the patterned implant is performed first, the blanket doping must not overcome the patterned doped regions. In this example, the n-type dopants are introduced in large enough quantities so that the blanket doped region 400 remains as p-type but the patterned doped regions 401 are n-type.

In the embodiments of the process described herein, the dopants may be, for example, P, As, B, Sb, or Sn. Other dopant species also may be used and this application is not limited merely to the dopants listed.

Blanket doping may be performed in many ways. For example, blanket doping of the region of the solar cell or the entire solar cell may be performed using ion implantation, such as with a beam-line ion implanter, a flood implanter, an implanter that modifies a plasma sheath, or a plasma doping ion implanter. Blanket doping also may be performed using diffusion in a furnace using either at least one gas or at least one paste on the solar cell substrate. Other methods of introducing dopants are also known and are applicable. In all case, blanket doping refers to a doping process where ions are non-discriminately applied to an entire surface of the solar cell.

In contrast to blanket doping, patterned doping means that only select regions of the solar cell are modified. This patterned doping may be performed in multiple ways. In some embodiments, a patterning technique is used to shield (or expose) only certain portions of the substrate. After this pattern is applied, one or more of the processes described above that are used to apply a blanket doping can be performed. In a first embodiment, a mask is used to block areas of the solar cell where counterdoping is not required. The mask may be of various types. For example, a hard mask is one which is applied to and adheres to the substrate. A shadow or proximity mask is one which is placed directly in front of the substrate, and may be reused. Finally, a stencil or projection mask is one in which the mask is placed a distance from the substrate and relies on optics to project a pattern onto the substrate. In some embodiments, the apertures in the mask are typically made using straight edges, and therefore a square or rectangular aperture may be easier to create than a circular one. However, a square, rectangular, polygonal, or circular aperture may be fabricated. After the mask is applied, a subsequent diffusion or ion implantation step is performed to introduce ions only to the exposed portions of the substrate. In one further embodiment, ion implantation is then performed, such as using a beam-line ion implanter, a flood implanter, or a plasma doping ion implanter, and dopants are only implanted through the one or more apertures in the mask. In another instance, the mask is used with a furnace diffusion method.

Patterned doping also may be performed using other methods. As described above, several of these patterning methods shield a portion of the substrate, so that only the exposed portion is doped. For example, photolithography may be used to create a photoresist mask. Other patterning methods are used to expose a portion of the substrate. For example, in one embodiment, a dielectric layer is applied using a blanket doping method. A laser beam may then be used to direct write onto the solar cell to selectively melt the blanket dielectric layer to create a mask. The term "direct write" refers to the process wherein a beam of light or particles, such as a laser or ion beam, is focused with high precision at the substrate. At the areas of incidence, the beam strikes the substrate and causes a specific effect. In the case of an ion beam, the effect may be one of implanting ions in the substrate. In the case of a laser beam, the effect may be to melt or deform the area of incidence.

In another embodiment, material may be printed onto selected regions of the surface of the solar cell. Ion implantation, for example, is then used to introduce dopants through the mask formed by the printed material. Alternatively, the printed material may be used to selectively etch an underlying dielectric, forming a pattern through which dopants can be introduced by diffusion in a furnace. In another embodiment, an ion beam may direct write or be projected through a shadow mask to change the etch characteristics of a blanket dielectric layer. This layer is then etched to expose the substrate only in select regions. In each of these patterning methods, ion implantation or furnace diffusion, for example, is then used to introduce dopants to the desired portion of the substrate.

In other embodiments, direct patterning of the dopant may be performed on the solar cell. The direct patterning form of patterned doping means that only certain regions of the solar cell are doped without the use of a mask or fixed masking layer on the solar cell. In one embodiment, dopants may be implanted with a non-uniform dopant dose using an ion beam. Thus, a first portion of the solar cell is exposed to the ion beam and implanted with a first dose. A second portion of the solar cell also is exposed to the ion beam and implanted with a second dose. This difference in dosage can be achieved in a number of ways.

An ion beam may be created in a number of ways. For example an ion beam can be created by forming a ribbon beam. In other embodiments, a scanning spot beam is created. These ion beams may be mass analyzed or non-mass analyzed. In other embodiments, an implant can be performed by modifying a plasma sheath or by directing ions in a plasma. Downstream of the ion beam, the solar cell is attached to a substrate holder. The substrate holder provides a plurality of degrees of movement. For example, the substrate holder can be moved in the direction orthogonal to the beam. Assume the beam is in the XZ plane. This beam can be a ribbon beam, or a scanned spot beam. The substrate holder can move in the Y direction. By doing so, the entire surface of the substrate can be exposed to the ion beam, assuming that the substrate has a smaller width than the ion beam (in the X dimension).

In one embodiment, the movement of the substrate holder is modified so as to create longer dwell times at the regions corresponding to the counterdoped regions. In other words, the substrate holder is moved more quickly in the Y direction over those portions of the substrate that are not to be further implanted (i.e. the blanket implant regions). Once the ion beam is positioned over a region that is to be counterdoped, the speed of the substrate holder in the Y direction slows. This slower speed is maintained while the ion beam is over the counterdoped region. Once that region has been fully exposed, the translational speed of the substrate holder increases so as to quickly pass over the subsequent lightly blanket implant regions. This process is repeated until the entire substrate has been implanted. This technique can be used to implant the lines 403, shown in FIG. 10 and FIG. 11, described below.

Direct patterning also may be performed using a blanket layer of dopant-containing paste applied to a solar cell. The paste is selectively melted using a scanned laser beam so that only certain regions of the paste-covered region are doped. This is an example of direct write.

In an alternative embodiment, the paste also may be selectively applied to the solar cell so that only certain paste-covered regions are doped using a furnace. The paste can be selectively applied in many ways. Screen printing, ink jet printing, and extrusion are a few examples. Other methods can also be used and are within the scope of the disclosure.

Figure 8:
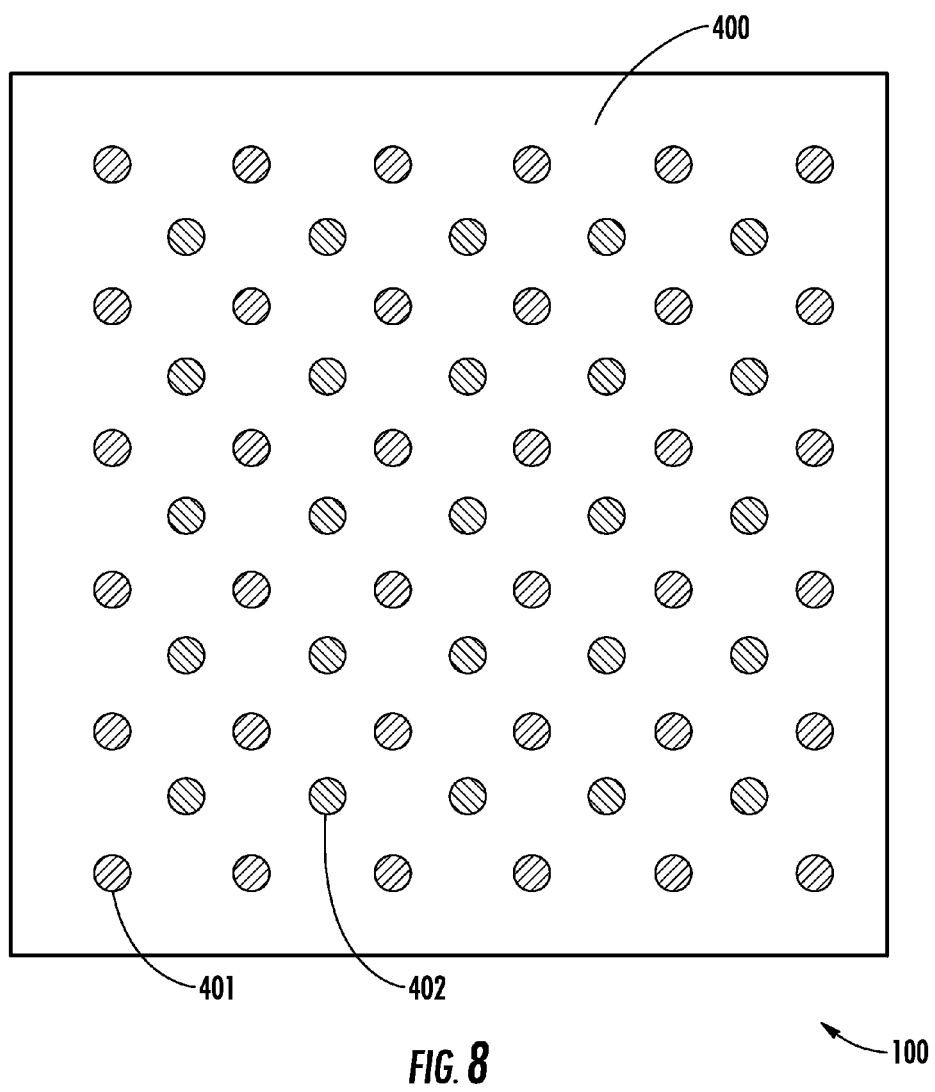
FIG. 8 is another embodiment of a point contact solar cell.
Figure 9:
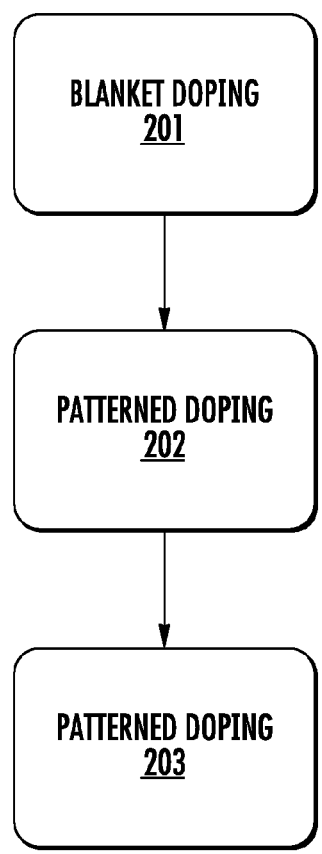
FIG. 9 is an embodiment of a solar cell manufacturing process flow used in conjunction with the solar cell of FIG. 8.

Additional process steps may also be introduced. FIG. 8 shows a bottom view of a point contact solar cell 100 having addition p++ regions 402. In other words, regions 402 are more heavily doped emitter regions. In some embodiments, the patterned doped regions 401 and heavily doped emitter regions 402 may be circular, rectangular, or polygonal. As described above, regardless of shape, these discrete heavily doped emitter regions are referred to as dots. For example, it may be beneficial to introduce more heavily p-doped emitter regions 402 for subsequent attachment to contacts. In this embodiment, a second patterned implant is performed, using the same dopant as that used for the blanket implant. Thus, the solar cell has a blanket doped region 400 serving as an emitter, patterned doped regions 401 that are n-type, and heavily p-doped emitter (p++) regions 402. FIG. 9 shows a flowchart for this process. The blanket doping step 201 and the first patterned doping step 202 are as described in FIG. 4. The second patterned doping step 203 is used to create the heavily p-doped emitter (p++) doped regions. As described earlier, these steps can be performed in any order and may be chained together and performed without breaking vacuum.

Figure 10:
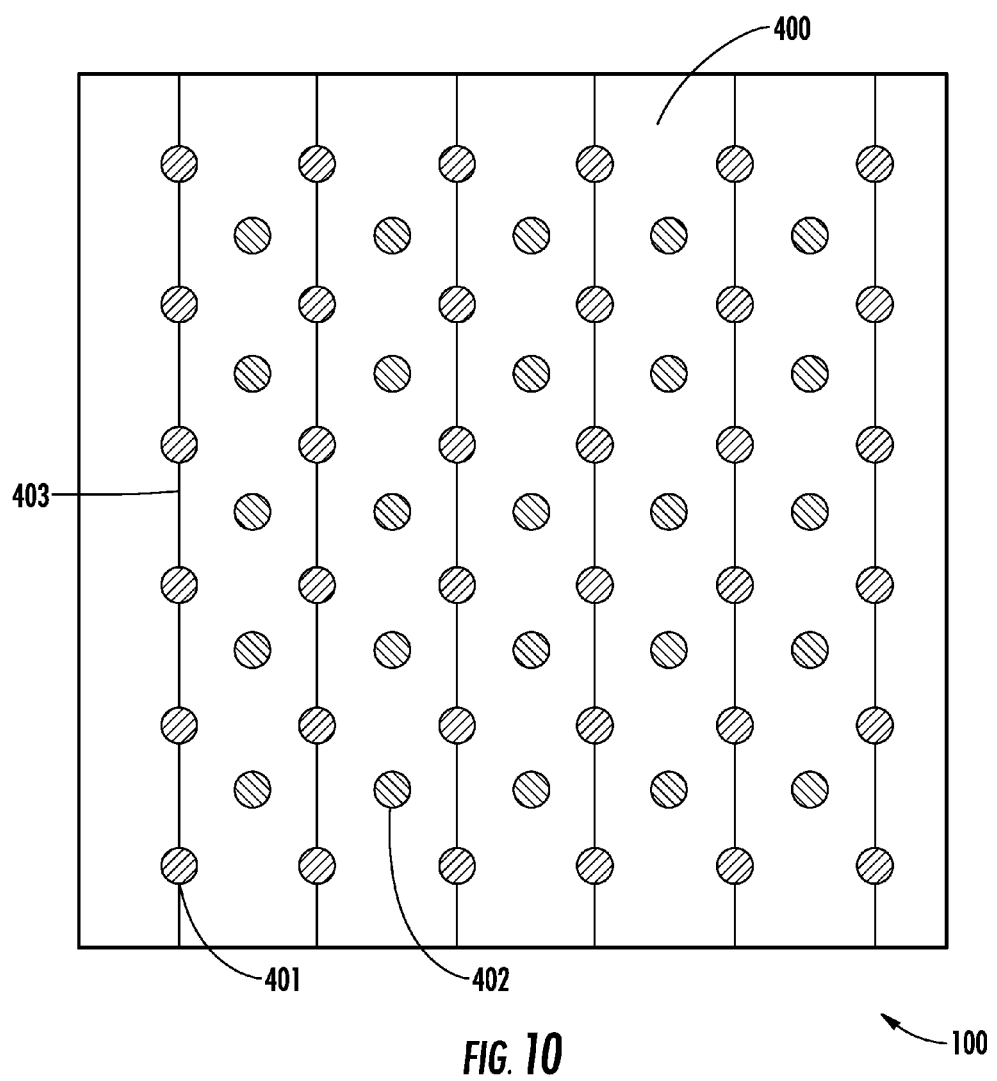
FIG. 10 is another embodiment of a point contact solar cell.

Furthermore, counterdoped lines may be introduced to reduce lateral resistance of the majority carriers. FIG. 10 shows a bottom view of a solar cell 100 having counterdoped lines 403 connecting the n-type patterned doped regions 401. These lines are created so as to connect two or more discrete n-type patterned doped regions 401.

In some embodiments, the counterdoped lines 403 span the entire width of the solar cell 100, thereby effectively separating the blanket doped region 400 into several distinct portions. These counterdoped lines 403 may be applied using a shadow mask. In other embodiments, a hard or soft mask may be used to create this pattern implant. In other embodiments, an electrostatically focused ion beam may be used to implant the counterdoped lines 403. In other embodiments, the dwell time of the ion beam is changed, as described above.

Figure 11:
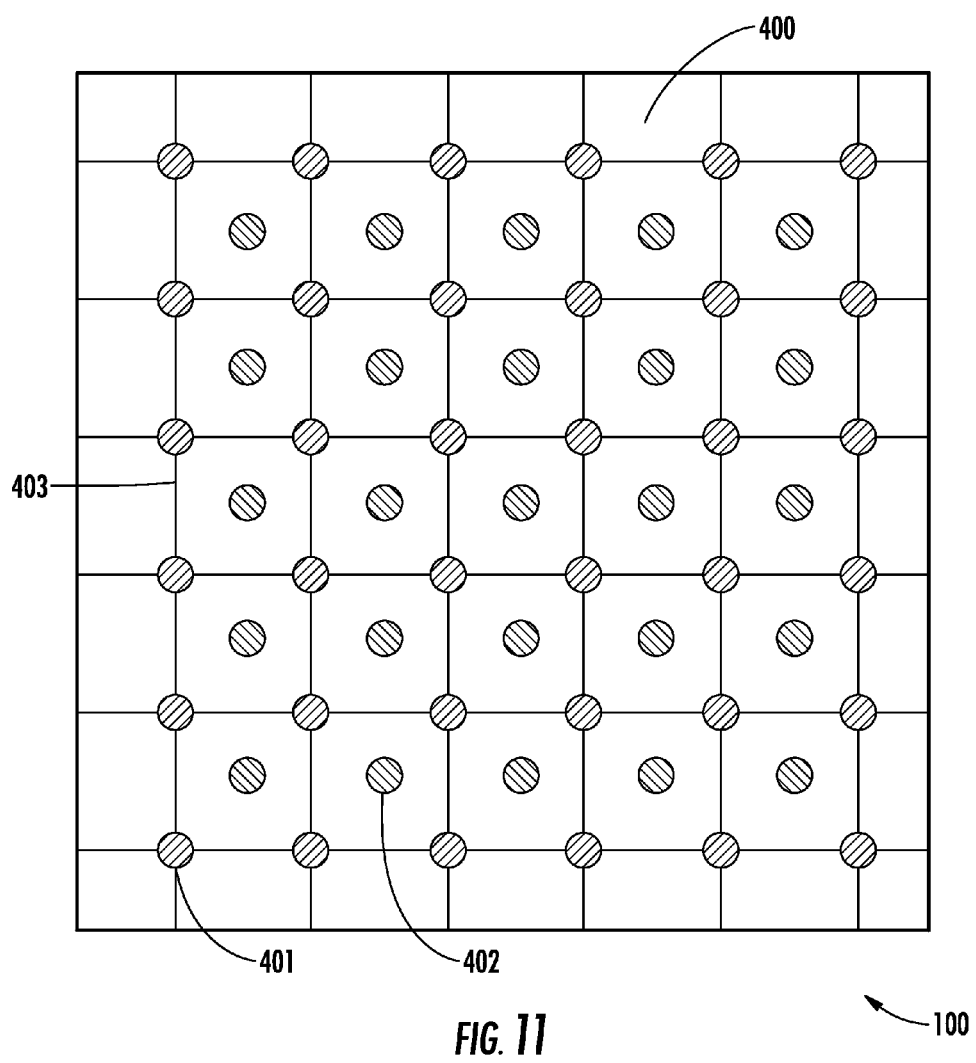
FIG. 11 is another embodiment of a point contact solar cell.

In another embodiment, counterdoped lines are implanted in two directions, such as perpendicular to one another. FIG. 11 shows a bottom view of a solar cell 100 having both vertical and horizontal counterdoped lines 403. These two sets of lines may be implanted in separate process steps or at least partly simultaneously. The mask or solar cell may be rotated in between these process steps.

Figure 12:
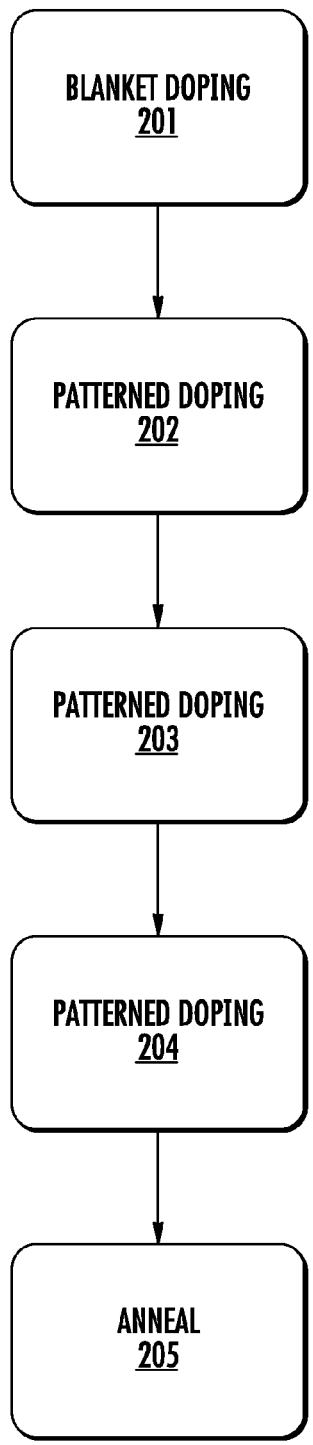
FIG. 12 is an embodiment of a solar cell manufacturing process flow used in conjunction with the solar cells of FIGS. 10 and 11.

FIG. 12 shows a flowchart for a process that may be used to create the solar cell of FIG. 10 or FIG. 11. The blanket doping step 201 is used to create the emitter. Patterned doping step 202 is used to create the BSF, while patterned doping step 203 is optionally used to create heavily p-doped emitter (p++) regions. The patterned doping step 204 is used to create the counterdoped lines 403 in one or more process steps. As was described in conjunction with the back surface field, these counterdoped lines are implanted with sufficient concentration so as to reverse the conductivity of the blanket implant 201. After all of the implant steps have been completed, the substrate is then annealed as shown in step 205.

In any of the embodiments that incorporate ion implantation, after the dopants have been implanted, the substrate is annealed. Following the anneal step, an insulating layer may be applied to the back side of the solar cell. This insulating layer may be any suitable material, such as silicon oxide. In some embodiments, after the insulating layer is applied, holes are made in the insulating layer to allow contact with the BSF and p++ regions. In other embodiments, the insulating layer is formed so as not to be applied in these areas proximate the BSF and p++ regions. In other embodiments, the silicon oxide can be thermally grown during the anneal step. Conductive materials are then used to connect the back surface fields together. A second set of conductive materials is used to connect the p++ regions or emitter regions together.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of creating a point contact solar cell, comprising:
   providing a substrate having a first conductivity;
   performing a blanket implant on a surface of said substrate with a species of a second conductivity, said second conductivity being opposite said first conductivity, so as to create a base of said first conductivity and an emitter of said second conductivity;
   performing a patterned implant of said surface of said substrate using a species of said first conductivity to create discrete counterdoped regions of said first conductivity on said surface, wherein said counterdoped regions are electrically connected to said base;
   performing a second patterned implant on said surface of said substrate using a species of said second conductivity to create highly doped emitter regions; and
   performing a patterned implant on said surface of said substrate with a species of said first conductivity so as to create lines connecting said discrete counterdoped regions, wherein the lines connecting said discrete counterdoped regions reduce lateral resistance.

2. The method of claim 1, wherein said counterdoped regions are circular or rectangular.

3. The method of claim 1, further comprising affixing metal contacts to said counterdoped regions and said highly doped emitter regions.

4. The method of claim 1, wherein said lines are in one direction.

5. The method of claim 1, wherein said lines are in two perpendicular directions, thereby creating a grid pattern.

6. The method of claim 1, further comprising affixing metal contacts to said counterdoped regions and said highly doped emitter regions.

7. A method of creating a point contact solar cell, comprising:
   providing a substrate having a first conductivity;
   performing a blanket implant on a surface of said substrate with a species of a second conductivity, said second conductivity being opposite said first conductivity, so as to create a base of said first conductivity and an emitter of said second conductivity;

performing a patterned implant on said surface of said substrate using a species of said first conductivity so as to counterdoped regions on said surface so as to create discrete counterdoped dots of said first conductivity on said surface, wherein said counterdoped dots are electrically connected to said base and;

performing a second patterned implant on said surface of said substrate using a species of said second conductivity to create highly doped emitter regions performing a patterned implant on said surface of said substrate with a species of said first conductivity so as to create lines connecting said discrete counterdoped dots, wherein the lines connecting said discrete counterdoped dots reduce lateral resistance.

8. The method of claim 7, wherein said lines are in one direction.

9. The method of claim 7, wherein said lines are in two perpendicular directions, thereby creating a grid pattern.

10. The method of claim 7, wherein said dots are circular or rectangular.

11. The method of claim 7, further comprising affixing metal contacts to said counterdoped dots.

\* \* \* \* \*